United States Patent
Park et al.

(10) Patent No.: US 10,796,065 B2
(45) Date of Patent: Oct. 6, 2020

(54) HYBRID DESIGN LAYOUT TO IDENTIFY OPTICAL PROXIMITY CORRECTION-RELATED SYSTEMATIC DEFECTS

(71) Applicant: KLA-TENCOR CORPORATION, Milpitas, CA (US)

(72) Inventors: Allen Park, San Jose, CA (US); Ankit Jain, Ballston Spa, NY (US)

(73) Assignee: KLA-Tencor Corporation, Milpitas, CA (US)

( * ) Notice: Subject to any disclaimer, the term of this patent is extended or adjusted under 35 U.S.C. 154(b) by 23 days.

(21) Appl. No.: 16/200,060

(22) Filed: Nov. 26, 2018

(65) Prior Publication Data
US 2019/0392111 A1 Dec. 26, 2019

Related U.S. Application Data

(60) Provisional application No. 62/688,271, filed on Jun. 21, 2018.

(51) Int. Cl.
| | |
|---|---|
| *G06F 30/398* | (2020.01) |
| *G03F 1/70* | (2012.01) |
| *G03F 7/20* | (2006.01) |
| *G03F 1/36* | (2012.01) |

(52) U.S. Cl.
CPC ............ *G06F 30/398* (2020.01); *G03F 1/36* (2013.01); *G03F 1/70* (2013.01); *G03F 7/70441* (2013.01)

(58) Field of Classification Search
USPC .......................................... 716/53
See application file for complete search history.

(56) References Cited

U.S. PATENT DOCUMENTS

| | | | |
|---|---|---|---|
| 2005/0076322 A1* | 4/2005 | Ye ................... | G06T 7/0004 716/52 |
| 2006/0062445 A1 | 3/2006 | Verma et al. | |
| 2007/0035728 A1 | 2/2007 | Kekare et al. | |
| 2010/0047698 A1 | 2/2010 | Lin et al. | |
| 2012/0290990 A1* | 11/2012 | Toyoda ............ | G03F 1/86 716/52 |
| 2015/0294057 A1 | 10/2015 | Lin et al. | |
| 2016/0162623 A1* | 6/2016 | Lutich ............. | G06F 30/398 716/51 |
| 2017/0186584 A1 | 6/2017 | Lin et al. | |
| 2019/0204749 A1* | 7/2019 | Tel ................... | G03F 7/705 |

OTHER PUBLICATIONS

WIPO, ISR for PCT/US2019/36640, Oct. 16, 2019.

* cited by examiner

*Primary Examiner* — Bryce M Aisaka
(74) *Attorney, Agent, or Firm* — Hodgson Russ LLP

(57) ABSTRACT

Defects can be identified using a hybrid design layout that includes a printable layer and a non-printed layer. The hybrid design layout can be generated by incorporating at least a portion of the non-printable layer layout with the printable layer layout. Defects can be identified using optical or scanning electron beam images.

17 Claims, 10 Drawing Sheets

All 3 layers as printed. Creating more dense pattern.

HYBRID DESIGN LAYOUT TO IDENTIFY OPTICAL PROXIMITY CORRECTION-RELATED SYSTEMATIC DEFECTS

CROSS-REFERENCE TO RELATED APPLICATIONS

This application claims priority to the provisional patent application filed Jun. 21, 2018 and assigned U.S. App. No. 62/688,271, the disclosure of which is hereby incorporated by reference.

FIELD OF THE DISCLOSURE

This disclosure relates to identifying defects in semiconductor devices.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

As densities and complexities of integrated circuits (ICs) continue to increase, inspecting photolithographic mask patterns becomes more challenging. Every new generation of ICs has denser and more complex patterns that currently reach and/or exceed optical limitations of lithographic systems. To overcome these optical limitations, various resolution enhancement techniques (RET), such as optical proximity correction (OPC), have been introduced. For example, OPC helps to overcome some diffraction limitations by modifying photomask patterns such that the resulting printed patterns correspond to the original desired patterns. Such modifications can include perturbations to sizes and edges of main IC features (i.e., printable features). Other modifications involve additions of serifs to pattern corners and/or providing nearby sub-resolution assist features (SRAF), which are not expected to result in printed features and, therefore, are referred to as non-printable features. OPC features and SRAF can be added to the design to enhance printing of the features on the wafer without actually being printed themselves. These non-printable features are expected to cancel pattern perturbations that would otherwise have occurred during the printing process. However, OPC makes mask patterns even more complex and usually dissimilar to resulting wafer images.

OPC can be used to compensate for image errors due to diffraction or process effects. The need for OPC is due to the limitations of light to maintain the edge placement integrity of the original design, after processing, into the etched image on the silicon wafer. These projected images appear with irregularities such as line widths that are narrower or wider than designed, which can sometimes be compensated for by changing the pattern on the photomask used for imaging. Other distortions such as rounded corners are driven by the resolution of the optical imaging tool and are harder to compensate for. Such distortions, if not corrected for, may significantly alter the electrical properties of what was being fabricated. OPC corrects these errors by moving edges or adding extra polygons to the pattern written on the photomask. The objective is to reproduce on the semiconductor wafer, as well as possible, the original layout drawn by the designer.

The two most visible benefits of OPC are correcting linewidth differences seen between features in regions of different density (e.g., center versus edge of an array, or nested versus isolated lines), and line end shortening (e.g., gate overlap on field oxide). For the former case, this may be used together with resolution enhancement technologies such as scattering bars (sub-resolution lines placed adjacent to resolvable lines) together with linewidth adjustments. For the latter case, "dog-ear" (serif or hammerhead) features may be generated at the line end in the design.

SRAF are useful where lithographic targets are particularly sensitive to focus. SRAF are very small mask features designed to improve processes margins and enhance resolution for isolated features through additional constructive or destructive interference, but are not intended to be printed on the resulting wafer. Existing lithographic technology requires deconvolution of dose and focus using some form of critical dimension metrology data and separation of data to determine focus response.

Existing approaches use design layout files to either simulate or group defects. Defects are grouped based on design layout, such as in a design based binning (DBB) approach, to separate systematic failures from random defects. Simulation using a design layout can be used to identify potential fail sites, which can be millions or even billions of locations.

This conventional DBB approach works relatively well for single layer patterning. However, DBB has at least two problems for multiple patterning. First, if all three layers are used to run DBB, failure due to one source (layer specific issue) can be separated into 3× or more bins due to variations in the subsequent unrelated patterns. This would dilute the actual failure into multiple bins and, therefore, can be overlooked when sampling defects. When single mask layer is used to run DBB, it results in too many empty clips and provides useless design based grouping (DBG) results.

OPC-related or SRAF-related problems also can result in an empty pattern group, which means the pattern group may not be separated or identified as unique pattern. FIG. 1 illustrates an exemplary DBG special case. Defects with a blank extended bounding box (EBB) are grouped together regardless of pattern variation outside of EBB that represents different failure modes. An empty EBB has no polygon on the current layer, but there may be invisible content behind it. This invisible content may include an assist structure printing unwanted pattern. The previous layer can cause systematic nuisance.

This can be a problem for sparse layers such as contacts in middle of line (MOL) or back end of line (BEOL) where even a 250 nm EBB is not large enough to prevent empty EBB. DBG uses a physical vertex inside EBB to define center of a seed window and may have no concept of coordinates inside EBB. Defining a virtual vertex or location is not possible unless a change to the algorithm is made. However, it may not be possible to change the algorithm to address this example with a sparse layer.

Defects that arise from insufficient SRAF are difficult to identify due to the lack of design pattern at the location of failure. Due to the use of multi-patterning techniques, OPC problems can be diluted into multiple bins when all masks are combined when running DBG. A post-OPC design layout may be used, but it is not practical for reasons such as an inability to access design files. This also may not be practical because of the increased complexity of a design (>10×), and any grouping with such design files is computationally challenging.

Currently, grouping by empty EBB can be used to identify areas where unwanted features print (e.g., SRAF printed on wafer) or to identify problematic OPC sites which may have large empty area. Empty EBB also can be used to identify problems observed on via and poly cut 1 layers and other multi-patterning layers. However, grouping by empty EBB is too slow for the semiconductor manufacturing industry because of its nature of computation. Running DBG will increase throughput and ease of use (EOU), but this approach faces other problems. A large area exists with no polygon nearby, especially if a single layer is used. Use of large EBB will merge unrelated defects into a bin. Use of a virtual location without a vertex will create an infinite number of groups for the same pattern. Empty areas also can prohibit root cause analysis.

Locations in a design also can be used to group based on geometric hash values. This may use a larger area to generate grouping and can negatively impact throughput efficiency. This technique may be too slow for semiconductor manufacturers.

Therefore, improved defect identification methods and systems are needed.

BRIEF SUMMARY OF THE DISCLOSURE

A system is provided in a first embodiment. The system includes a stage configured to hold a wafer; a detector configured to receive a beam reflected from the wafer; and a processor in electronic communication with the detector. The processor is configured to receive an image of the wafer that includes at least one defect and to identify the defect on the wafer using a hybrid design layout that includes a printable layer and a non-printed layer.

The beam may be a photon beam, in which case the system further includes a light source. The beam also may be an electron beam, in which case the system further includes an electron source.

The processor can be further configured to receive the printable layer layout and the non-printed layer layout for the wafer and to generate the hybrid design layout by incorporating at least a portion of the non-printable layer layout with the printable layer layout.

The non-printed layer can include optical proximity correction or sub-resolution assist features. The non-printed layer also can include an artificial layer that is generated by the processor.

A method is provided in a second embodiment. An image of a wafer and a hybrid design layout are received at a processor. The hybrid design layout includes a printable layer and a non-printed layer. Using the processor, one or more defects on the wafer are identified using the hybrid design layout.

In an instance, the printable layer layout for the wafer and the non-printed layer layout for the wafer are received at the processor. The hybrid design layout can be generated using the processor by incorporating at least a portion of the non-printable layer layout with the printable layer layout. Receiving the printable layer layout can include receiving a pre-optical proximity correction graphical data selection layer for active polygons in a layer of the wafer. Receiving the non-printed layer layout can include extracting sub-resolution assist features. Receiving the non-printed layer layout also can include obtaining layers of the wafer that include only sub-resolution assist features that have a rectilinear shape.

The hybrid design layout may be a new graphical data selection file or a reticle design file.

The non-printed layer can include optical proximity correction or sub-resolution assist features. The non-printed layer also can include an artificial layer that is generated by the processor.

A non-transitory computer-readable storage medium is provided in a third embodiment. The non-transitory computer-readable storage medium comprises a hybrid design data structure. The hybrid design data structure includes a printable layer and a non-printed layer.

The non-transitory computer-readable storage medium can further include one or more programs for identifying one or more defects on the wafer using the hybrid design layout.

In an instance, the non-transitory computer-readable storage medium further includes one or more programs for executing the following steps on one or more computing devices. The steps include receiving the printable layer layout and the non-printable layer layout for the wafer and generating the hybrid design layout by incorporating at least a portion of the non-printable layer layout with the printable layer layout.

The non-printed layer can include optical proximity correction or sub-resolution assist features. The non-printed layer can include an artificial layer, which can be generated by a processor.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein identify systematic defects related to OPC and SRAF quality using inspection data, especially for multi-patterning environment where no suitable solution currently exists. Multi-layer processing (double patterning lithography (DPL), triple patterned lithography (TPL), quadruple patterning lithography (QPL)) can be used even after extreme ultraviolet (EUV) lithography implementation because feature sizes continue to shrink. Changes to techniques and data formats, such as those disclosed herein, can be used to address the challenges and deficiencies of previous techniques.

Figure 1:
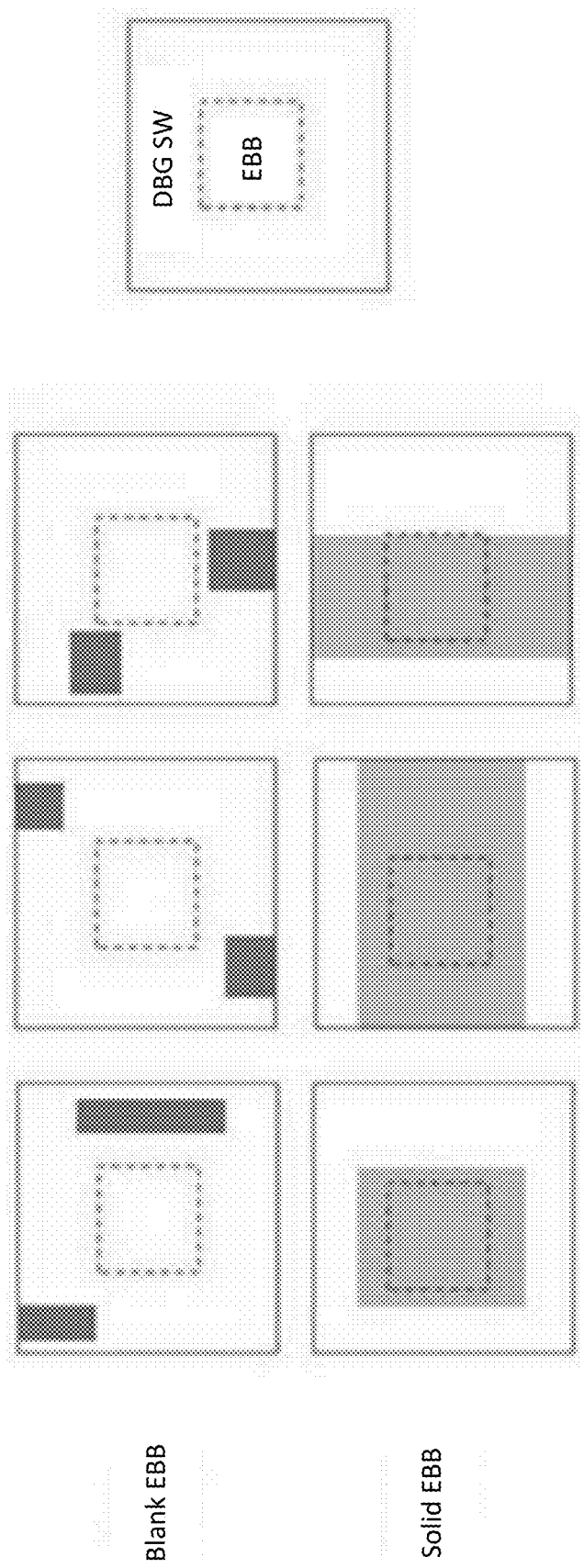
FIG. 1 illustrates an exemplary DBG special case.
Figure 2:
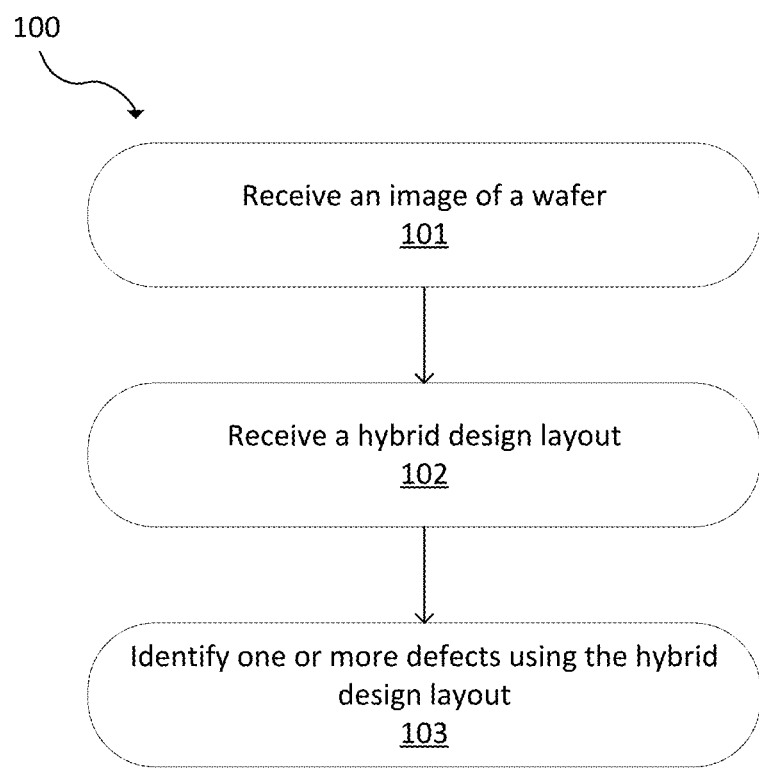
FIG. 2 is a flowchart of a method in accordance with the present disclosure.

FIG. 2 is a flowchart of a method 100. At 101, an image of a wafer is received at a processor. A hybrid design layout is received at the processor at 102. The hybrid design layout includes a printable layer and a non-printed layer. The printable or non-printed layers can be selected, such as using standard design file verification languages like standard verification rule format (SVRF). The printable layer includes layers that are printed or otherwise formed on a semiconductor wafer. Thus, the printable layer can be part of the IC. For example, printable layers can be layers that are printed on the wafer and may be functional circuitry. Examples of a printable layer include the contact layers for MOL or BEOL.

The non-printed layer can include OPC, SRAF, an artificial layer that is generated by the processor, a static random-access memory (SRAM) marker layer, an epitaxy marker layer, an implant layer that can support inspection, or an additional layer created to support inspection.

In an instance, one or more artificial layers can be used for alignment and binning purposes. The artificial layer can be generated or an existing non-printed layer can be modified. Implementation for each design can be based on set up rules, which can be an algorithm. Polygons in the artificial layer can be generated independently or can be derived from existing polygons. For example, an SRAM marker layer can be derived from existing polygons. When they repeat in a certain order that is set up as a different layer.

The hybrid design layout may be, for example, a graphic data system (GDS) file or a reticle design file (RDF). Information can be, for example, streamed into a new GDS (e.g., OASIS) or RDF where the combination is generated. Either GDS or RDF can combine the various layers into a hybrid design layout, however keeping the layers separate in RDF may provide certain benefits such as improved alignment or improved binning.

Electron beam systems, broad band plasma (BBP) systems, optical systems, laser scattering systems, or other systems can be used to generate the information used for inspection.

The hybrid design layout may not include OPC features because the file size may be too large, but may include scattering bars that do not print on a wafer. Without OPC features, the file itself may not be production-worthy.

At 103, one or more defects on the wafer are identified using the hybrid design layout. Coordinate alignment may be performed to use the image of the wafer with the hybrid image. Creating the design file is done in a different way to include these additional polygons and used in design verification language to isolate the new polygons (e.g., identify the new polygons). This can provide improved binning and improved unique defect identification.

Defects also can be grouped. For example, OPC-related failures and SRAF-related failures can be identified using the hybrid design layout.

To generate the hybrid design layout, a printable layer layout for the wafer and a non-printed layer layout for the wafer are received at the processor. The hybrid design layout can be generated using the processor by incorporating at least a portion of the non-printable layer layout with the printable layer layout. Thus, the hybrid design layout can include both pre-OPC active polygons and SRAF. The hybrid design layout with the printable layer layout and non-printed layer layout can be a virtual layer for wafer inspection. All or part of the non-printable layers (e.g. OPC and SRAF) may be used in generating the hybrid design layout.

Receiving the printable layer layout can include receiving a pre-OPC GDS layer for active polygons in a layer of the wafer. For example, an OASIS file may be received.

Receiving the non-printed layer layout can include extracting SRAF. SRAF can be extracted using SVRF language.

Receiving the non-printed layer layout can include obtaining layers of the wafer that include only SRAF that have a rectilinear shape. The rectangles, polygons, or other shapes that are used in the hybrid design layout can be generated by the processor in a manner similar to other embodiments disclosed herein. However, these shapes for the hybrid design layout may appear in a different layer.

The hybrid design layout can be generated without interrupting current flow.

The hybrid design layout can create a new layer that is not used for production or defect inspection, which can reduce or eliminate a semiconductor manufacturer's concerns about sharing design data.

Non-printed layers may be modified based on dimension and density. For example, based on the definition of what constitutes an "empty" area, certain polygons may be filtered out, combined, or modified. Some of non-printed polygons can be modified or reduced to be used as centroid to defining seed window for pattern grouping. Embodiments disclosed herein can pre-filter the hybrid layout to reduce and/or concatenate some blocks to combine them, which can constitute an "empty" area.

Using post-OPC GDS to address the challenge of OPC/SRAF related issues may be computationally-intensive and may require information that is not available from a semiconductor manufacturer. Using the hybrid design layer disclosed herein can mitigate these concerns.

The method 100 provides multiple benefits. First, computational requirements are reduced using the hybrid design layout because most of the additional edges and vertices are in the active polygons on the post-OPC layer. For example, eliminating vertices means less computational power is required. The vertices can be eliminated by the embodiments disclosed herein. For example, the layout can be filtered to reduce vertices. SRAF typically adds a fraction of the additional data. Second, use of the hybrid design layout can enable new grouping that was not possible using the traditional pre-OPC design approach because an algorithm like DBG can be used with the hybrid design layout to provide a new grouping scheme. Third, use of a hybrid design layout can separate SRAF-related issues from other patterning defects. Fourth, sensitive data from a semiconductor manufacturer is not needed. Thus, if a semiconductor manufacturer does not want to provide information or does not have the requested information, then the inspection can continue.

Figure 3:
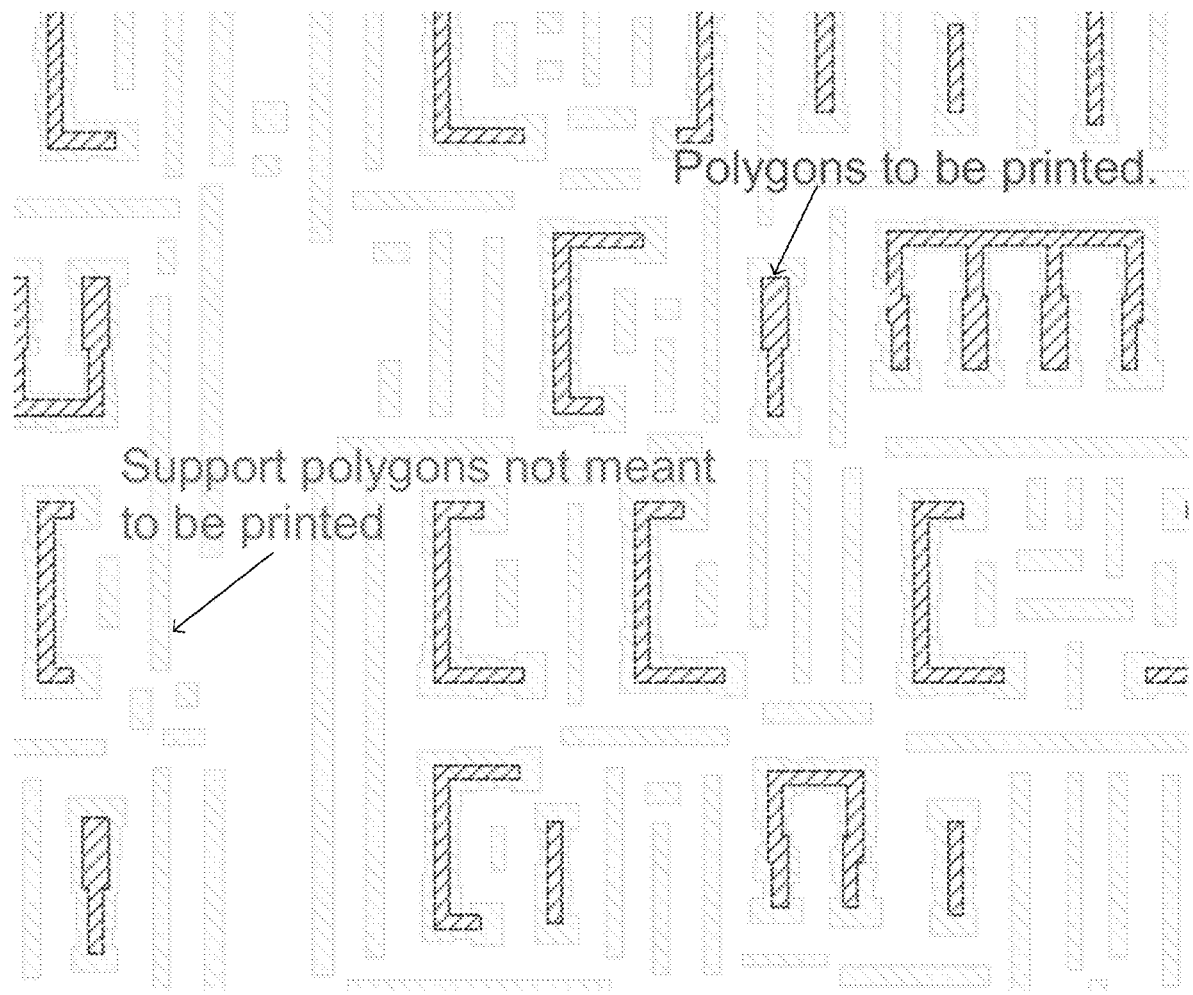
FIG. 3 is an exemplary diagram illustrating SRAF.
Figure 4:
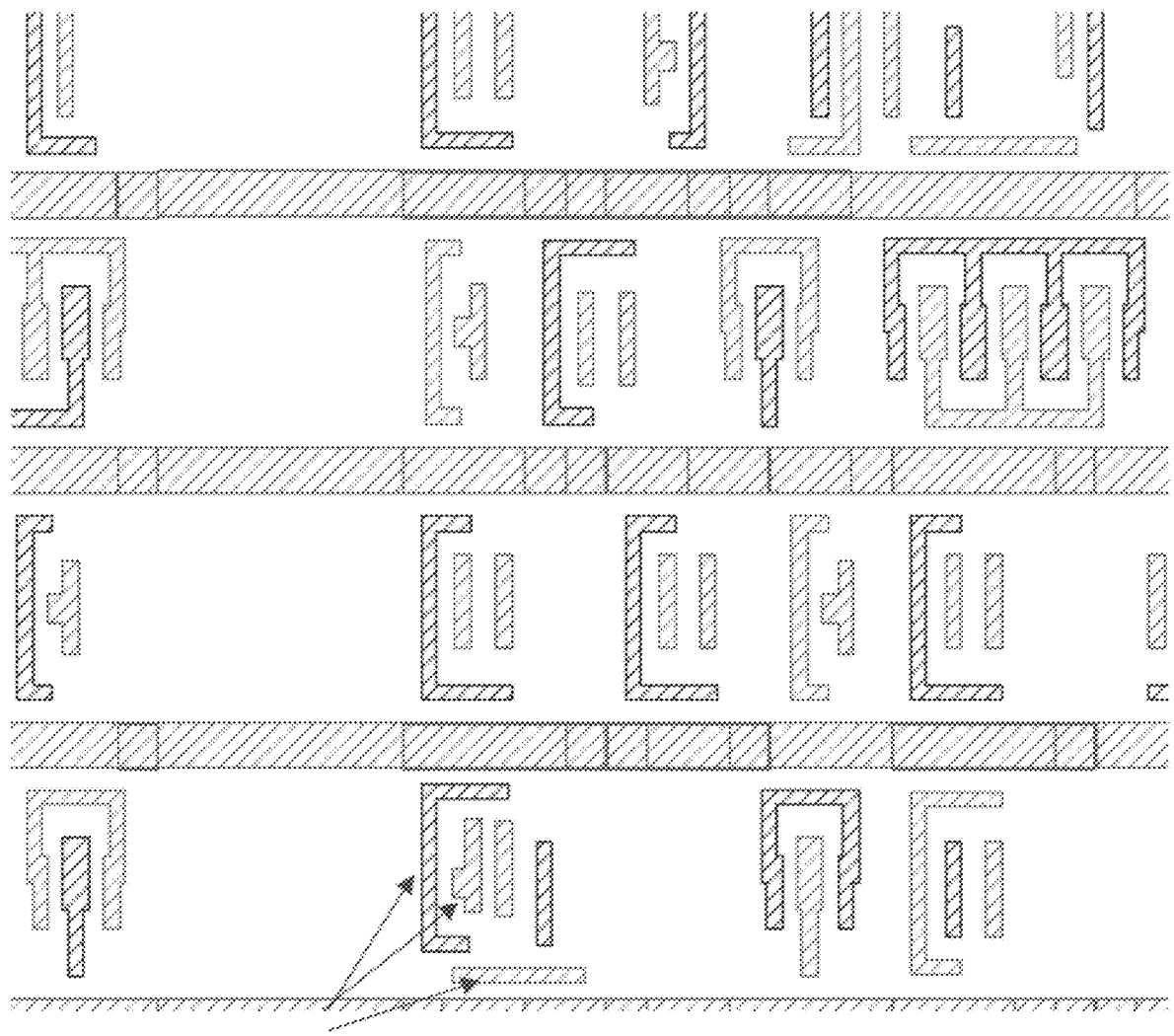
FIG. 4 is an exemplary diagram illustrating the layer of FIG. 3 that is printed.

Use of a single layer in multi-patterning lithography results in sparse areas. FIG. 3 is an exemplary diagram illustrating SRAF. FIG. 4 is an exemplary diagram illustrating the layer of FIG. 3 that is printed, which may be an example of TPL. Structures of interest are shown in the single layer with SRAF. DBB can operate on the single layer without SRAF. The post-OPC layout may be needed for grouping, but is not always available.

Figure 5:
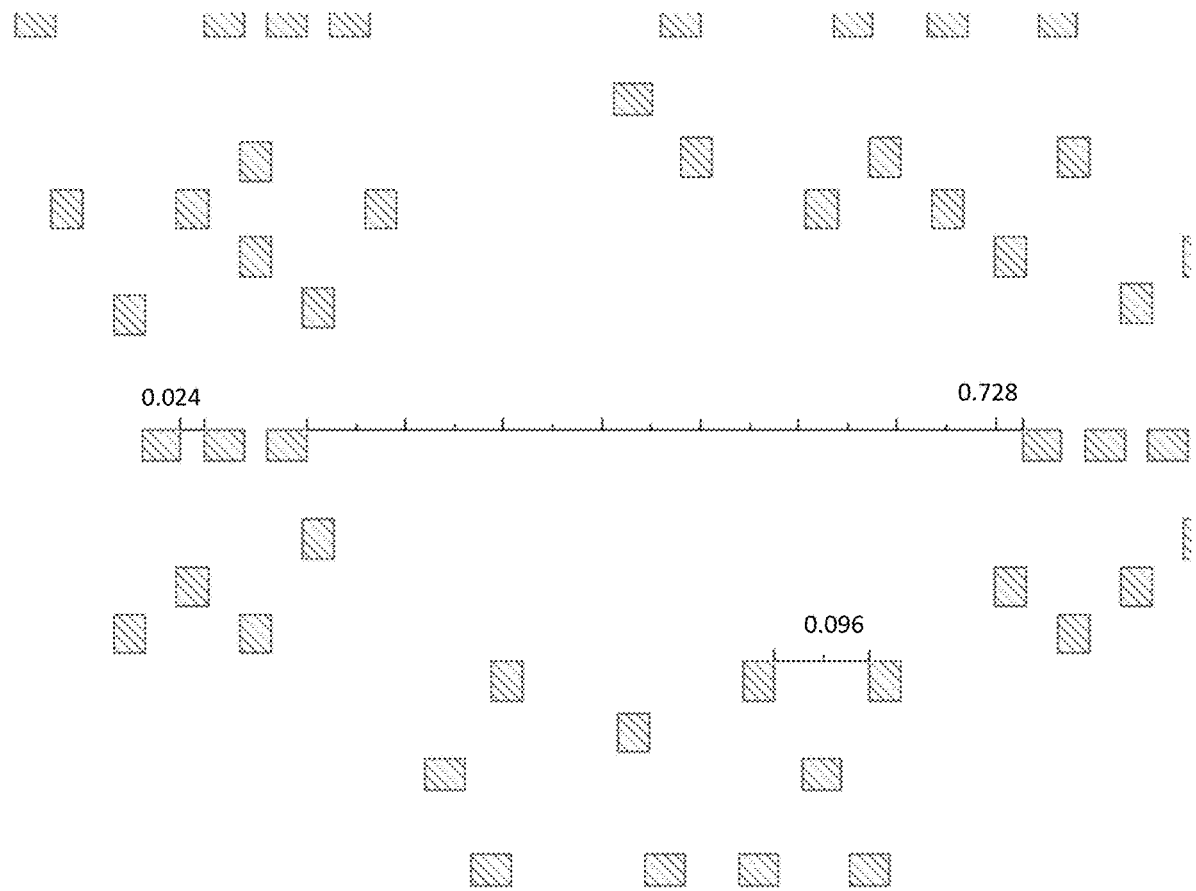
FIG. 5 is an exemplary diagram of large areas without polygons on a 10 nm scale.

FIG. 5 is an exemplary diagram of large areas without polygons on a 10 nm scale. Due to use of multi-patterning and SRAF, much area is left empty based on individual layer. Use of large EBB for DBB is not a suitable solution because it will introduce noise in the data.

Figure 6:
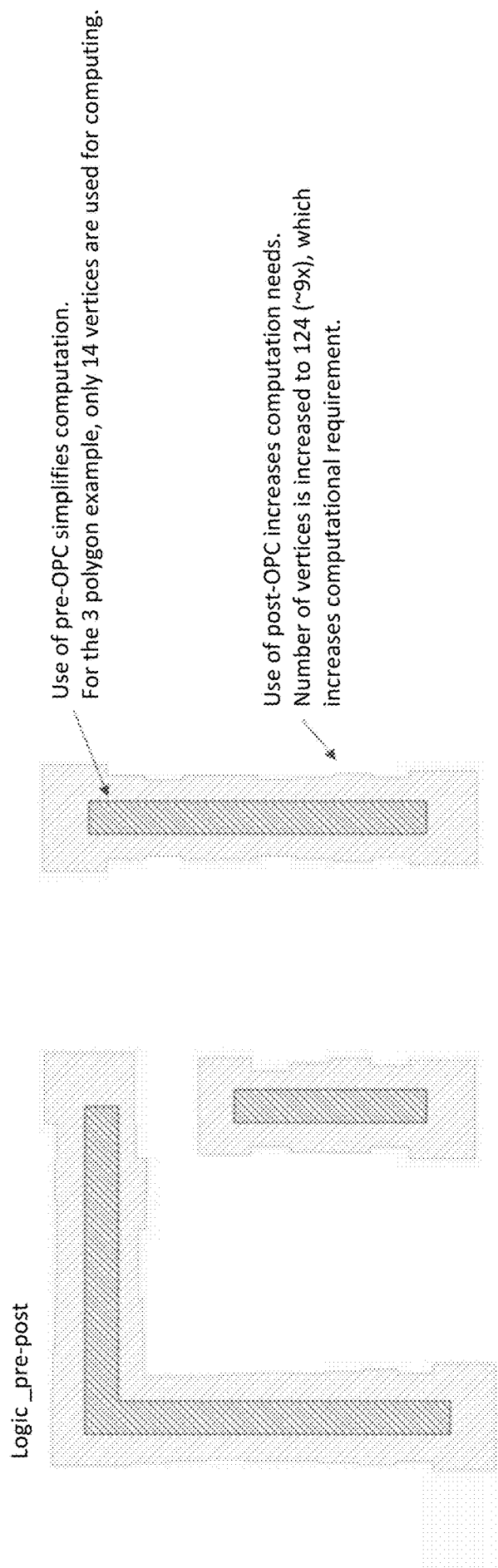
FIG. 6 illustrates the computation impact using a post-OPC layout.

FIG. 6 illustrates the computation impact using a post-OPC layout. More vertices and edges can require higher amount of computation to be production worthy. However, post-OPC can add greater than 6× or more vertex count compared to a pre-OPC design. Post-OPC features are not typically used by semiconductor manufacturers, but also require extra computing to process the additional vertices and edges for data comparison.

Figure 9:
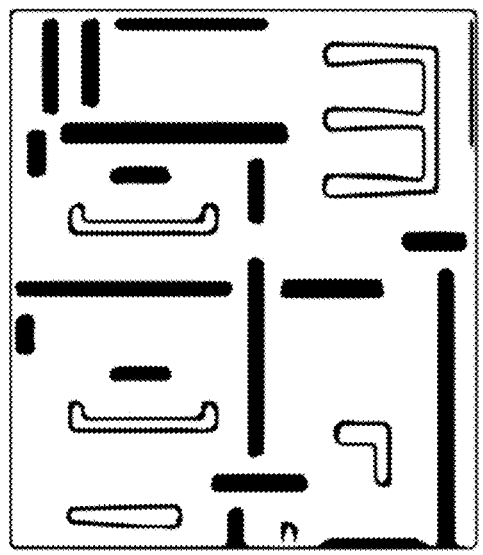
FIG. 9 is an exemplary hybrid design layout that uses the pre-OPC design with assist features.
Figure 8:
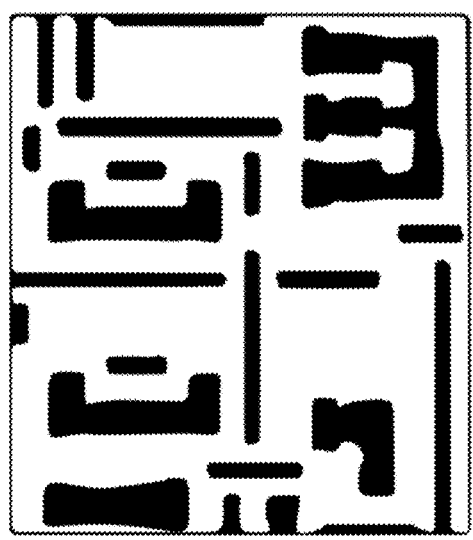
FIG. 8 is an exemplary post-OPC layout with information including restricted OPC features.
Figure 7:
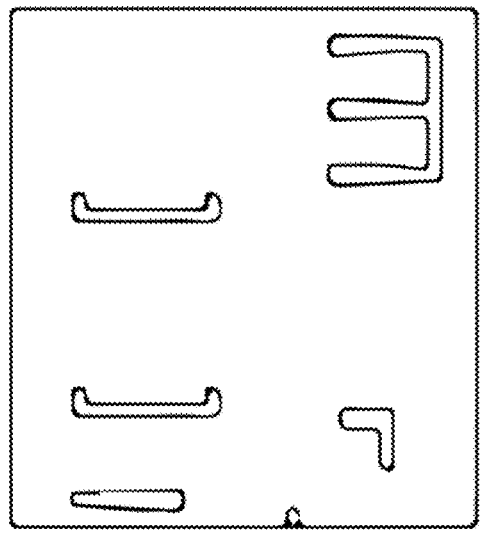
FIG. 7 is an exemplary pre-OPC layout with empty spaces for an algorithm to anchor onto.

FIGS. 7-9 illustrate an exemplary hybrid design layout for systematic defect identification, which can be used to find systematic defects. FIG. 7 is an exemplary pre-OPC layout with empty spaces for an algorithm to anchor onto. The lack of vertices can limit the ability to group based on defects that are found in the empty space. FIG. 8 is an exemplary post-OPC layout with information including restricted OPC features. The increased number of vertices can require intensive computation to process design clips. FIG. 9 is an exemplary hybrid design layout that uses the pre-OPC design with assist features. Using embodiments disclosed herein, such as the example in FIG. 9, can reduce computation intensity. Furthermore, the layout is not printable because OPC features are absent from the file. This can be used for inspection.

Figure 10:
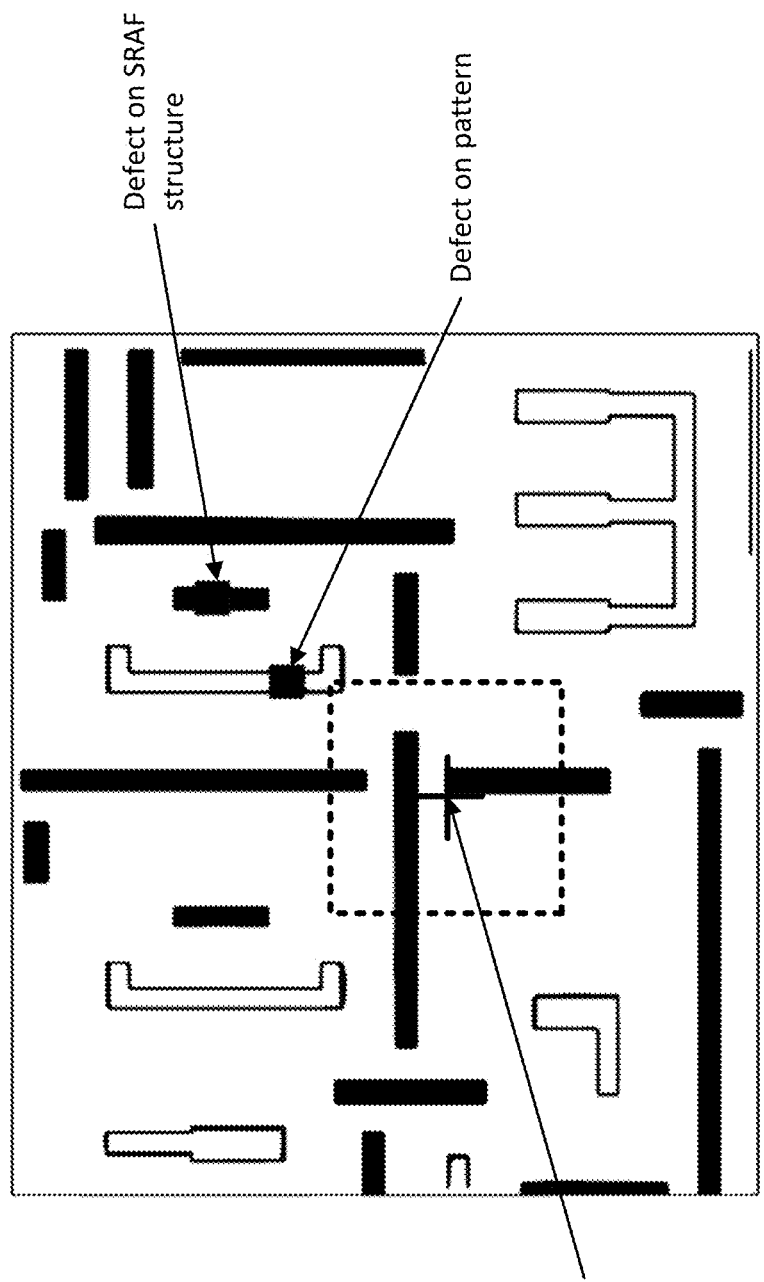
FIG. 10 is an exemplary application of the hybrid design layout of FIG. 9.

FIG. 10 is an exemplary application of the hybrid design layout of FIG. 9. Defects on pattern and defects on empty space can be differentiated.

Figure 11:
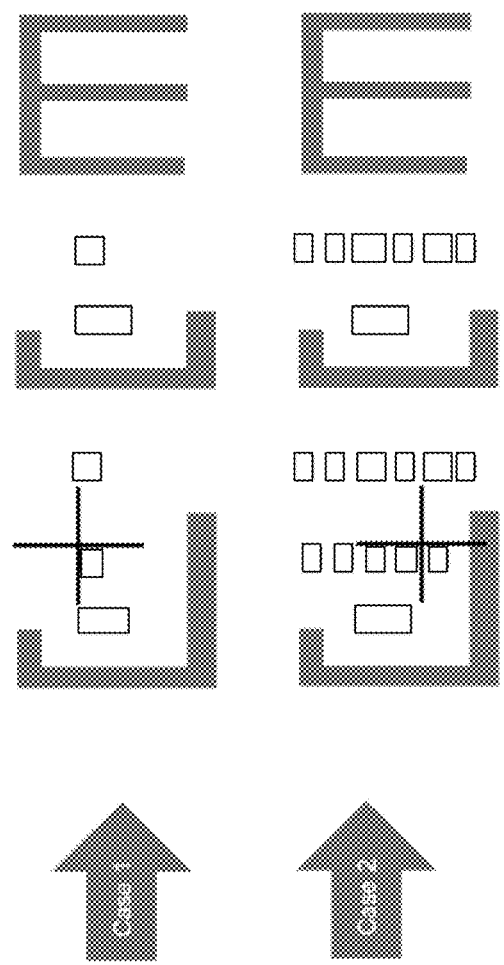
FIG. 11 is an exemplary diagram of non-printed modification.
Figure 11:
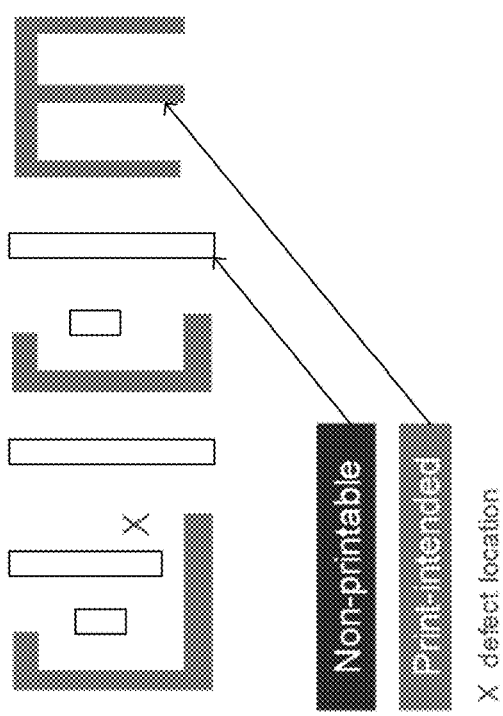

FIG. 11 is an exemplary diagram of non-printed modification. In Case 1, non-printable polygons that are long have been shortened to be used as an anchor point for grouping purposes. A location of the empty space can be pinpointed while reducing potential location error due to a vertex being far away from the defect. In Case 2, long bars can be fragmented into points so that vertex closest to defect can be used as anchor point.

Figure 12:
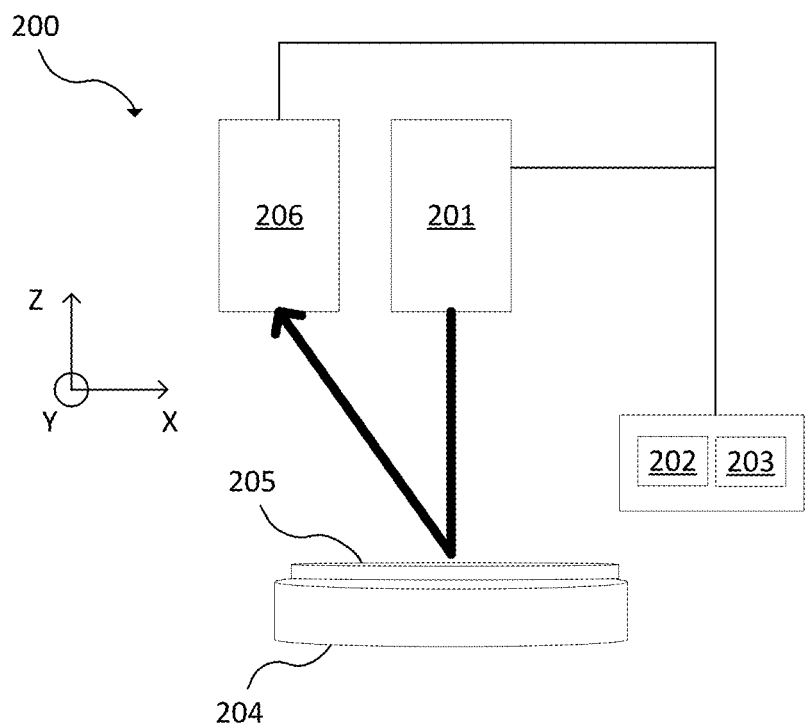
FIG. 12 is a block diagram of a system in accordance with the present disclosure.

FIG. 12 is a block diagram of a system 200. The beam source 201 may produce a beam of light, a beam of electrons, an x-ray beam, or may use other techniques to measure a surface of the wafer 205. In one example, the wafer inspection tool 200 is an optical tool and the beam source 201 includes a laser or a lamp. In another example, the wafer inspection tool 200 is a broad-band plasma tool and the beam source 201 includes a broad-band plasma source. In another example, the wafer inspection tool 200 is an electron beam tool and the beam source 201 includes an electron beam source. In yet another example, the wafer inspection tool 200 is an x-ray tool and the beam source 201 includes an x-ray source. In yet another example, the wafer inspection tool 200 is a laser scattering system and the beam source 201 includes a laser source. The beam source 201 can provide information about the wafer 205 or can provide information used to form images of the wafer 205. The wafer 205 may be on a stage 204.

The wafer inspection tool 200 communicates with a processor 202 and an electronic data storage unit 203 in electronic communication with the processor 202. For example, the processor 202 can communicate with the beam source 201, detector 206, or other components of the wafer inspection tool 200. The processor 202 may be implemented in practice by any combination of hardware, software, and firmware. Also, its functions as described herein may be performed by one unit, or divided up among different components, each of which may be implemented in turn by any combination of hardware, software, and firmware. Program code or instructions for the processor 202 to implement various methods and functions may be stored in controller readable storage media, such as a memory in the electronic data storage unit 203, within the processor 202, external to the processor 202, or combinations thereof.

While only one processor 202 and electronic data storage unit 203 are illustrated, more than one processor 202 and/or more than one electronic data storage unit 203 can be included. Each processor 202 may be in electronic communication with one or more of the electronic data storage units 203. In an embodiment, the one or more processors 202 are communicatively coupled. In this regard, the one or more processors 202 may receive readings received at the beam source 201 and store the reading in the electronic data storage unit 203 of the processor 202. The processor 202 and/or electronic data storage unit 203 may be part of the wafer inspection tool 200 itself or may be separate from the wafer inspection tool 200 (e.g., a standalone control unit or in a centralized quality control unit).

The processor 202 may be coupled to the components of the wafer inspection tool 200 in any suitable manner (e.g., via one or more transmission media, which may include wired and/or wireless transmission media) such that the processor 202 can receive the output generated by the wafer inspection tool 200, such as output from the detector 206. The processor 202 may be configured to perform a number of functions using the output. For instance, the processor 202 may be configured to image features on the wafer 205. In another example, the processor 202 may be configured to send the output to an electronic data storage unit 203 or another storage medium without reviewing the output. The processor 202 may be further configured as described herein.

The processor 202, other system(s), or other subsystem(s) described herein may take various forms, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system (s) may include a platform with high speed processing and software, either as a standalone or a networked tool. For example, the processor 202 may include a microprocessor, a microcontroller, or other devices.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 202 also may be part of a defect review system, an inspection system, a metrology system, or some other type of system. Thus, the embodiments disclosed herein describe some configurations that can be tailored in a number of manners for systems having different capabilities that are more or less suitable for different applications.

The processor 202 may be in electronic communication with the beam source 201 or other components of the wafer inspection tool 200. The processor 202 may be configured according to any of the embodiments described herein. The processor 202 also may be configured to perform other functions or additional steps using the output of the beam source 201 or using images, measurements, or data from other sources.

In another embodiment, the processor 202 may be communicatively coupled to any of the various components or sub-systems of wafer inspection tool 200 in any manner known in the art. Moreover, the processor 202 may be configured to receive and/or acquire data or information from other systems (e.g., inspection results from an inspection system such as a review tool, another metrology tool, a remote database including design data and the like) by a transmission medium that may include wired and/or wireless portions. In this manner, the transmission medium may serve as a data link between the processor 202 and other subsystems of the wafer inspection tool 200 or systems external to wafer inspection tool 200.

In some embodiments, various steps, functions, and/or operations of wafer inspection tool 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape and the like. A carrier medium may include a transmission medium such as a wire, cable, or wireless transmission link. For instance, the various steps described throughout the present disclosure may be carried out by a single processor 202 (or computer system) or, alternatively, multiple processors 202 (or multiple computer systems). Moreover, different sub-systems of the wafer inspection tool 200 may include one or more computing or logic systems. Therefore, the above description should not be interpreted as a limitation on the present disclosure, but merely an illustration.

The processor 202 can be configured to receive an image of the wafer that includes at least one defect and to identify the defect on the wafer using a hybrid design layout that includes a printable layer and a non-printed layer. The processor 202 can be further configured to receive a printable layer layout and a non-printed layer layout for the wafer and to generate the hybrid design layout by incorporating at least a portion of the non-printable layer layout with the printable layer layout. The non-printed layer can include optical proximity correction or sub-resolution assist features. The non-printed layer also can include an artificial layer that is generated by the processor.

The electronic data storage unit 203 can store or otherwise contain the hybrid design layout for a wafer 205 or can store or otherwise hold the non-printable layer layout and/or the printable layer layout for the wafer 205.

The beam of light or other beam from the beam source 201 may be directed at the wafer 205 at an angle and can be reflected from the wafer 205 to the detector 206 at a same angle or at a different angle. The beam from the beam source 201 can be directed perpendicular to a surface of the wafer 205 or can be directed at the wafer 205 at a different angle.

An additional embodiment relates to a non-transitory computer-readable medium comprises a hybrid design data structure. The hybrid design data structure includes a printable layer and a non-printed layer. The non-printed layer can include OPC, SRAF, or other features. The non-printed layer also can include an artificial layer that is generated by the processor.

An additional embodiment relates to a non-transitory computer-readable medium storing program instructions executable on a controller for performing a defect identification, as disclosed herein. The one or more programs can identify one or more defects on the wafer using the hybrid design layout. In an instance, the one or more programs can execute the following steps on one or more computing devices. A printable layer layout for the wafer is received. A non-printed layer layout for the wafer is received. The hybrid design layout is generated by incorporating at least a portion of the non-printable layer layout with the printable layer layout.

Each of the steps of the method may be performed as described herein. The methods also may include any other step(s) that can be performed by the controller and/or computer subsystem(s) or system(s) described herein. The steps can be performed by one or more processors, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   a stage configured to hold a wafer;
   a detector configured to receive a beam reflected from the wafer; and
   a processor in electronic communication with the detector, wherein the processor is configured to:
      receive an image of the wafer that includes at least one defect; and
      identify the defect on the wafer using a hybrid design layout that includes a printable layer layout formed on the wafer and a non-printed layer layout that includes an artificial layer generated by the processor, wherein at least a portion of the non-printable layer layout is incorporated with the printable layer layout in the hybrid design layout, and wherein the hybrid design layout is a virtual layer.

2. The system of claim 1, wherein the beam is a photon beam, and wherein the system further comprises a light source.

3. The system of claim 1, wherein the beam is an electron beam, and wherein the system further comprises an electron source.

4. The system of claim 1, wherein the processor is further configured to:
- receive the printable layer layout for the wafer;
- receive the non-printed layer layout for the wafer; and
- generate the hybrid design layout by incorporating at least a portion of the non-printable layer layout with the printable layer layout.

5. The system of claim 1, wherein the non-printed layer includes optical proximity correction or sub-resolution assist features.

6. A method comprising:
- receiving, at a processor, an image of a wafer;
- receiving a hybrid design layout at the processor, wherein the hybrid design layout includes a printable layer layout formed on the wafer and a non-printed layer layout that includes an artificial layer generated by the processor, wherein at least a portion of the non-printable layer layout is incorporated with the printable layer layout in the hybrid design layout, and wherein the hybrid design layout is a virtual layer; and
- identifying, using the processor, one or more defects on the wafer using the hybrid design layout.

7. The method of claim 6, further comprising:
- receiving, at the processor, the printable layer layout for the wafer;
- receiving, at the processor, the non-printed layer layout for the wafer; and
- generating the hybrid design layout using the processor by incorporating at least a portion of the non-printable layer layout with the printable layer layout.

8. The method of claim 7, wherein receiving the printable layer layout includes receiving a pre-optical proximity correction graphical data selection layer for active polygons in a layer of the wafer.

9. The method of claim 7, wherein receiving the non-printed layer layout includes extracting sub-resolution assist features.

10. The method of claim 7, wherein receiving the non-printed layer layout includes obtaining layers of the wafer that include only sub-resolution assist features that have a rectilinear shape.

11. The method of claim 6, wherein the hybrid design layout is a new graphical data selection file.

12. The method of claim 6, wherein the hybrid design layout is a reticle design file.

13. The method of claim 6, wherein the non-printed layer includes optical proximity correction or sub-resolution assist features.

14. A non-transitory computer-readable storage medium comprising a hybrid design data structure, wherein the hybrid design data structure includes:
- a printable layer layout formed on the wafer; and
- a non-printed layer layout that includes an artificial layer, wherein at least a portion of the non-printable layer layout is incorporated with the printable layer layout in the hybrid design layout, and wherein the hybrid design layout is a virtual layer.

15. The non-transitory computer-readable storage medium of claim 14, further comprising one or more programs for identifying one or more defects on the wafer using the hybrid design layout.

16. The non-transitory computer-readable storage medium of claim 14, further comprising one or more programs for executing the following steps on one or more computing devices:
- receive the printable layer layout for the wafer;
- receive the non-printed layer layout for the wafer; and
- generate the hybrid design layout by incorporating at least a portion of the non-printable layer layout with the printable layer layout.

17. The non-transitory computer-readable storage medium of claim 14, wherein the non-printed layer includes optical proximity correction or sub-resolution assist features.

* * * * *